US009786344B1

United States Patent
Abedifard et al.

(10) Patent No.: US 9,786,344 B1
(45) Date of Patent: Oct. 10, 2017

(54) PROGRAMMING OF MAGNETIC RANDOM ACCESS MEMORY (MRAM) BY BOOSTING GATE VOLTAGE

(71) Applicant: Avalanche Technology, Inc., Fremont, CA (US)

(72) Inventors: Ebrahim Abedifard, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 15/614,450

(22) Filed: Jun. 5, 2017

Related U.S. Application Data

(60) Continuation of application No. 15/417,135, filed on Jan. 26, 2017, now Pat. No. 9,691,464, which is a continuation-in-part of application No. 15/203,455, filed on Jul. 6, 2016, now Pat. No. 9,558,802, which is a division of application No. 14/253,192, filed on Apr. 15, 2014, now Pat. No. 9,401,194, which is a continuation of application No. 13/842,747, filed on Mar. 15, 2013, now Pat. No. 8,792,269.

(51) Int. Cl.
*G11C 11/00* (2006.01)
*G11C 11/16* (2006.01)

(52) U.S. Cl.
CPC ........ *G11C 11/1675* (2013.01); *G11C 11/161* (2013.01); *G11C 11/1697* (2013.01)

(58) Field of Classification Search
CPC .................................................. G11C 11/16
USPC ....... 365/48, 55, 62, 66, 74, 78, 80–93, 100, 365/130, 131, 148, 158, 171–173, 209, 365/213, 225.5, 230.07, 232, 243.5; 216/22; 257/295, 421, E21.665; 438/3; 428/810–816, 817–825.1, 826; 977/933–935
See application file for complete search history.

(56) References Cited

U.S. PATENT DOCUMENTS

| | | | | |
|---|---|---|---|---|
| 7,742,329 B2* | 6/2010 | Yoon | .................... | G11C 11/1659 365/158 |
| 7,755,153 B2* | 7/2010 | Ho | ........................ | H01L 27/228 257/421 |
| 8,107,280 B2* | 1/2012 | Yoon | ........................ | G11C 8/08 365/158 |
| 2004/0175887 A1* | 9/2004 | Cha | ........................ | H01L 27/228 438/257 |

(Continued)

*Primary Examiner* — Harry W Byrne
(74) *Attorney, Agent, or Firm* — Bing K. Yen

(57) ABSTRACT

A method of programming an MTJ includes selecting the MTJ and an access transistor coupled thereto. The gate of the selected access transistor is coupled to a selected word line (WL), which is raised to a first voltage, Vdd, and is then allowed to float. The first voltage and a second voltage, Vx, are respectively applied to a selected bit line (BL) coupled to the selected MTJ and a selected source line (SL) coupled to the selected access transistor, thereby driving a switching current through the selected MTJ from the selected BL to SL. Alternatively, the switching current may be reversed by applying 0 V and Vdd to the selected BL and SL, respectively. Moreover, the second voltage is applied to other BLs not coupled to the selected MTJ and the first voltage is applied to other SLs not coupled to the selected access transistor, thereby boosting the voltage of the floating WL to above the first voltage.

8 Claims, 6 Drawing Sheets

(56) References Cited

U.S. PATENT DOCUMENTS

| | | | |
|---|---|---|---|
| 2007/0164381 A1* | 7/2007 | Ho | H01L 27/228 257/421 |
| 2008/0219043 A1* | 9/2008 | Yoon | G11C 11/1659 365/158 |
| 2010/0110775 A1* | 5/2010 | Yoon | G11C 8/08 365/158 |

* cited by examiner

PROGRAMMING OF MAGNETIC RANDOM ACCESS MEMORY (MRAM) BY BOOSTING GATE VOLTAGE

CROSS REFERENCE TO RELATED APPLICATIONS

The present application is a continuation of the commonly assigned application bearing Ser. No. 15/417,135 filed on Jan. 26, 2017 and entitled "Fast Programming of Magnetic Random Access Memory (MRAM)," which is a continuation-in-part of the commonly assigned application bearing Ser. No. 15/203,455 filed on Jul. 6, 2016 and entitled "Fast Programming of Magnetic Random Access Memory (MRAM)," which is a divisional application of the commonly assigned application bearing Ser. No. 14/253,192 filed on Apr. 15, 2014 and entitled "Fast Programming of Magnetic Random Access Memory (MRAM)," which is a continuation of U.S. patent application Ser. No. 13/842,747, filed on Mar. 15, 2013, by Abedifard et al., and entitled "Fast Programming of Magnetic Random Access Memory (MRAM)."

BACKGROUND OF THE INVENTION

Field of the Invention

The present invention relates generally to magnetic random access memory (MRAM) devices and more particularly to a method and apparatus for programming MRAM devices.

Description of the Prior Art

Magnetic random access memory (MRAM) devices include magnetoresistive tunnel junctions (MTJs), which are effectively the memory elements of the MRAM devices for storing binary data. Each MTJ may have two magnetic layers separated by a thin barrier layer made of magnesium oxide (MgO), which acts as a tunneling oxide layer in the MTJ. The magnetic orientation of each of the two magnetic layers may be directed perpendicular to the layer plane thereof. The magnetic orientations of these two layers, upon the application of a suitable electric current, determine the resistance state of the MTJ.

One of the magnetic layers of the MTJ typically has a fixed magnetic orientation while the other magnetic layer, typically referred to as a "free layer", can change its magnetic orientation during programming of the MTJ. If the two magnetic layers have the same magnetic orientation (parallel state), the resistance of the MTJ will be low. When they have the opposite magnetic orientations relative to one another (anti-parallel state), the resistance of the MTJ will be high.

Changing the binary or magnetic orientation (or "state") of an MTJ is referred to as "programming" (or "writing to") the MTJ. Programming is performed by forcing an electric current through the MTJ. Electrons passing through the fixed layer of the MTJ and into the free layer of the MTJ force the orientation of the free layer to become the same as that of the fixed layer. Whereas, forcing the electrons to travel from the free layer into the fixed layer causes the orientation of the fixed layer to remain unchanged, but the reflected electrons from the fixed layer change the orientation of the free layer to be opposite to that of the fixed layer. The amount of current required to change the orientation of the MTJ can be calculated using the following equation:

$$I = I0 * A * [1 - ((K*T)/(K0*V)) \text{Ln}(t/t0)] \qquad \text{Eq. (1)}$$

wherein "*" denotes a multiplication operation and "I0" is the current density per unit area, which is a variable that may depend on the MTJ fabrication technology. "A", in Eq. (1), is the MTJ area, "K" is the Boltzmann constant, "T" is temperature in degrees Kelvin. "K0" is the resultant magnetic field, "V" is the volume of the free layer, "t" is time in nano seconds (nSec), and t0 is 1 nSec. The value K0*V/K*T is called delta (A), and it is a measure of the stability of the MTJ relative to temperature. Based on the foregoing, the programming time can be calculated as follows:

$$t = t0 \exp[A*(1 - I/I0*A)] \qquad \text{Eq. (2)}$$

Eq. (2) clearly indicates that programming time is exponentially related to the MTJ current, which means in order to reduce programming time, a desired outcome, the programming current needs to be augmented. The programming current, also referred to herein as "electrical current" is typically provided by a select (or "access") transistor that is coupled to the MTJ and selects the MTJ for programming or reading.

The size of the access transistor can be arbitrarily made large to boost programming current, but enlarging the access transistor has the undesirable effect of increasing the size of the MRAM cell, which generally includes an MTJ and an access transistor. The MRAM cell size is typically dictated by the size of its access transistor. Accordingly, minimizing the size of the MRAM cell typically requires minimizing the size of the access transistor, which reduces the current for programming and/or reading the MTJ. Therefore, there is a conflict of smaller MTJ cell size versus higher programming current.

FIGS. 1a and 1b each show a typical MRAM cell 1 to include an access transistor 3 coupled to an MTJ 2, which is oriented in such a way that its fixed layer, rather than its free layer, is disposed closer to the access transistor 3. In FIG. 1a, the prior art MTJ 2, which functions like a variable resistor, is accessed by the transistor 3 through which it is programmed from an anti-parallel (AP) state to a parallel (P) state, or from a high MTJ resistance to a low MTJ resistance. "Anti-parallel" ("AP") refers to the magnetic orientations of the magnetic layers of the MTJ 2 being opposite to one another, whereas "parallel" ("P") refers to the magnetic orientations of the magnetic layers of the MTJ 2 being the same relative to each other, as shown in FIG. 1b.

FIG. 1b shows the prior art MTJ 2 programmed from a "P" state to an "AP" state using the access transistor 3. In the latter case, the current is exceptionally low, by as much as 40-60 percent. This is largely due to having higher voltage at the source of the transistor 3. The voltage required to program the MTJ 2, in this case when the MTJ 2 is being programmed from P to AP as shown in FIG. 1b, has the effect of raising the voltage at the source of the driving (or "access") transistor 3. Accordingly, the electrical current through the transistor 3 drops due to the reduction of the voltage from gate-to-source of the transistor 3, as well as due to the increase in the Vt of the transistor, which is the threshold voltage of the transistor 3. Vt increases because the voltage at the source of the transistor 3 acts as a substrate bias for the n-channel transistor. In this case, enlarging the size of the transistor 3 does not appreciably increase the electrical current of the transistor 3. Thus, the gate voltage of the transistor 3 needs to be increased to compensate for all these. To increase the gate voltage, one needs to consider at least two limitations. One is that in most designs the power supply voltage (Vdd) provided is limited for example to only 1 to 1.2 volts. The second limitation is that the transistor has certain tolerance limit to voltage. More than certain levels of voltage could damage the transistor. For example if the transistor is designed for 1.2 volts, voltages in excess of 1.44 V (20% excess voltage) could damage the transistor.

Accordingly, there is a need for an MTJ cell with small cell size yet higher electric current for reliably programming the MTJ.

SUMMARY OF THE INVENTION

The present invention is directed to a method for writing a magnetic random access memory (MRAM) device. The MRAM device includes an array of memory cells, each of which includes an MTJ and an access transistor coupled in series. The MRAM device further includes a plurality of word lines with each word line coupled to gates of a respective row of the access transistors along a first direction; a plurality of bit lines with each bit line coupled to a respective row of MTJs along a second direction; and a plurality of source lines with each source line coupled to sources of a respective row of the access transistors along the first direction.

In an embodiment, the method of writing a memory cell includes selecting an MTJ and an access transistor coupled thereto for programming. The gate of the selected access transistor is coupled to a selected word line (WL), which is raised to a first voltage, Vdd, and is then allowed to float. The first voltage and a second voltage, Vx, are respectively applied to a selected bit line (BL) coupled to the selected MTJ and a selected source line (SL) coupled to the selected access transistor, thereby driving a switching current through the selected MTJ from the selected BL to SL. Alternatively, the switching current may be reversed by applying 0 V and Vdd to the selected BL and SL, respectively. Moreover, the second voltage is applied to other BLs not coupled to the selected MTJ and the first voltage is applied to other SLs not coupled to the selected access transistor, thereby boosting the voltage of the floating WL to a third voltage (Vddx) above the first voltage. In an alternative embodiment, the third voltage may be directly applied to the selected WL.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

Figure 1A:
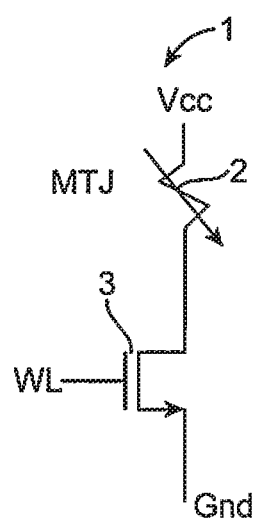
FIG. 1a shows the prior art MTJ 2 programmed from an "AP" state to a "P" state using the transistor 3.
Figure 1B:
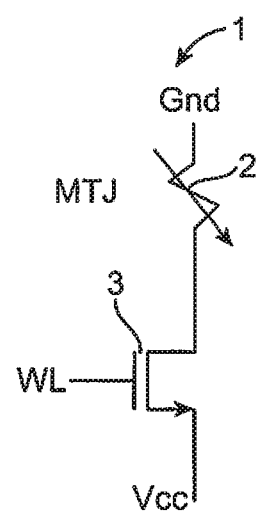
FIG. 1b shows the prior art MTJ 2 programmed from a "P" state to an "AP" state using the transistor 3.

In some embodiments of the invention, in order to overcome low current limitations, such as in the structure shown in FIG. 1b, the voltage at the gate of the access transistor that is coupled to a magnetoresistive tunnel junction (MTJ) of a magnetic random access memory (MRAM) cell is increased. As is further discussed shortly, two different embodiments and methods are disclosed for increasing or boosting the voltage at the gate of the access transistor or the voltage at a word line that is coupled to the MRAM cell. In one such method, a fixed voltage is used to augment or boost the voltage at the gate of the access transistor and in another such method, a bootstrapping technique is employed to augment or boost the voltage at the gate of the transistor.

In one embodiment, a method for programming an MTJ includes selecting an MTJ for programming. The MTJ to be programmed is coupled to an access transistor at one of the source and drain of the access transistor. The gate of the access transistor is coupled to a selected word line (WL), the selected WL being substantially at a first voltage, Vdd, which may be the power supply voltage. The WLs that are not coupled to the MTJ are grounded. A second voltage, Vx, is applied to the unselected bit lines (BLs) and further applied to a source line (SL), the SL being coupled to the other one of the source and drain of the access transistor. A third voltage, Vdd, is then applied to a selected BL, the selected BL being coupled to an end of the MTJ other than the end of the MTJ where the access transistor is coupled. The first voltage is applied to unselected SLs not coupled to the source of the access transistor, thereby causing the voltage of the WL to rise above the first voltage.

Figure 2:
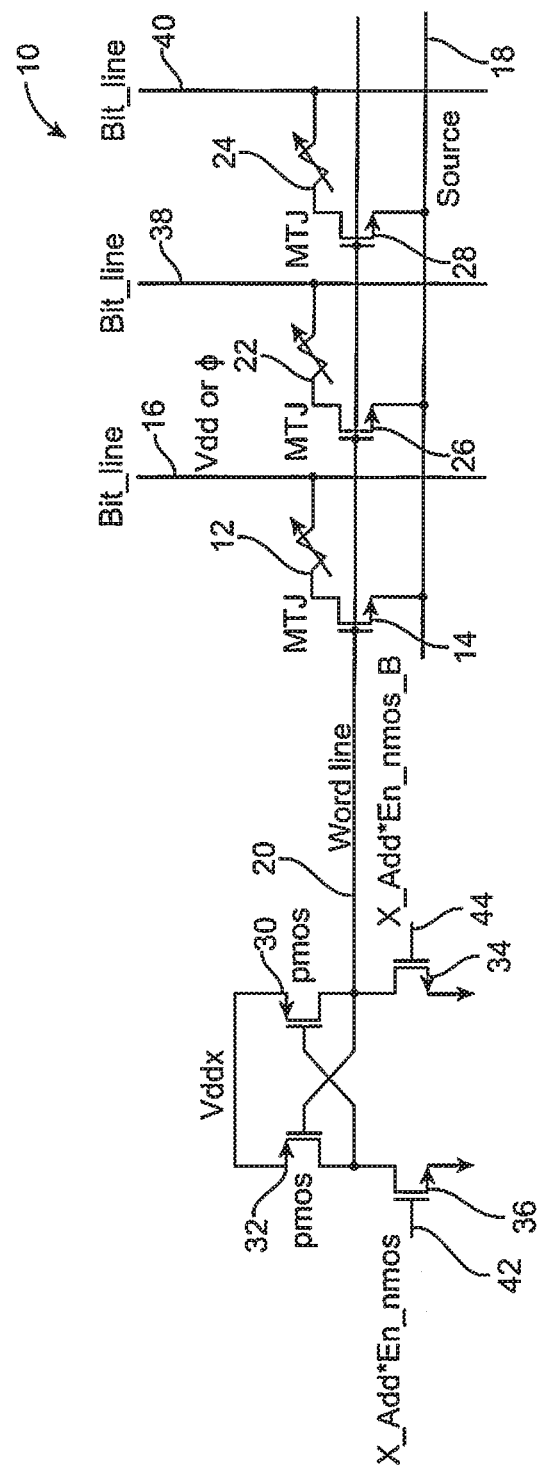
FIG. 2 shows a circuit 10 using a magnetic random access memory (MRAM) device in accordance with an embodiment and method of the invention.

FIG. 2 shows a circuit 10 using a magnetic random access memory (MRAM) device in accordance with an embodiment and method of the invention. The circuit 10 is shown to include an MTJ 12, an MTJ 22, and an MTJ 24. It is further shown to include access transistors 14, 26, and 28. Further shown to be a part of the circuit 10 are transistors 36, 34, 32, and 30, and bit lines (BLs) 16, 38 and 40, source line (SL) 18, and word line (WL) 20.

It is understood that while three BLs are shown in FIG. 2, additional BLs may be and are typically a part of the circuit 10. Similarly, while only three MTJs are shown in FIG. 2, the circuit 10 typically includes a greater number of MTJs and additional SLs and WLs.

The MTJ 12 is shown coupled to the transistor 14 at one end and to the BL 16 at an opposite end. Similarly, the MTJ 22 is shown coupled to the transistor 26 at one end and to the BL 38 at another end, and the MTJ 24 is shown coupled to the transistor 28 at one end and to the BL 40 at an opposite end. Each of the MTJs 12, 22, 24 includes at least a free layer and a fixed layer. In an embodiment, the magnetic orientations of the free and fixed layers are directed perpendicularly to their respective layer planes. In another embodiment, the magnetic orientations of the free and fixed layers are directed parallel to their respective layer planes. Moreover, in an embodiment, each of the MTJs 12, 22, 24 is oriented in such a way that its fixed layer is disposed closer to the respective transistor compared to its free layer. In other words, a current that flows from the SL 18 to the BL 16 will pass through the fixed layer before entering the free layer. In an alternative embodiment, each of the MTJs 12, 22, 24 is oriented in such a way that its free layer is disposed closer to the respective transistor compared to its fixed layer.

Each of the transistors 14, 26, and 28 is shown coupled to the SL 18 at its one of the source and drain and to the WL 20 at its gate. The transistors 34 and 36 are each shown coupled to ground at their sources. The transistor 36 is further shown coupled, at its gate, to the X_ADD*En_nmos signal 42 and the transistor 34 is shown coupled, at its gate, to the X_ADD*En_nmos B signal 44. The transistors 34 and 36 are typically NMOS transistors. The drain of the transistor 36 is shown coupled to the drain of the transistor 32, which is typically a PMOS transistor. Similarly, the drain of the transistor 34 is shown coupled to the drain of the transistor 30, which is also a PMOS transistor. The sources of the transistors 32 and 30 are shown coupled to each other. Further, the WL 20 is shown coupled to the drain of each of the transistors 36 and 34 and to the drain of each of the transistors 32 and 30. The gate of the transistor 30 is shown coupled to the drain of the transistor 32 and the source of each of the transistors 32 and 30 is shown coupled to Vddx, which may be a voltage generated by a charge pump and is higher than Vdd, which may be the power supply voltage. Vdd is also known in the art as a voltage representing a high state or a logical state of "1", and in an exemplary embodiment is 1.2 V. Vx is a voltage by which the WL 20 is boosted or augmented and in exemplary embodiments, it is approximately 0.3 V. In an embodiment, Vx is a voltage less than Vdd.

In the embodiment of FIG. 2, the MTJ 12 is selected to be programmed. In operation, during programming, the SL 18 is set to the voltage Vx or Vdd, and the BL 16 is set to Vdd or 0 V depending on the direction of the switching current driven through the MTJ 12. The BL 16 and the SL 18 are the selected BL and the selected SL that are used to select the MTJ 12 for programming, as is the WL 20, the selected WL. Other BLs, such as BLs 38 and 40, and other SLs and other WLs are not selected and are therefore referred to herein as "unselected". The unselected BLs, such as the BLs 38 and 40, and the unselected SLs are set to the voltage Vdd-Vt, where Vt is the threshold voltage of the transistor 14.

The voltage Vddx is applied to the WL 20 and the signal 44 is at a low state, which has the effect of turning on the transistor 30 and makes the signal 42 to be at a high state. The node where the transistor 32 is shown coupled to the transistor 30 then goes low and the transistor 30 turns on and the voltage at the WL 20 goes high but at a voltage that is higher than Vdd, such as Vddx, which turns off the transistor 32 and substantially no current goes through the transistor 32. If the selected bit line 16 is at Vdd (for example at 1.2 V) and selected source line 18 is at Vx, this effectively programs the MTJ 12 to go from a first resistance state to a second resistance state. To program the opposite from the second resistance state to the first resistance state when the word line 20 goes to Vddx, the source line 18 is coupled to Vdd (1.2 V), while the bit line 16 is grounded. In an embodiment, the first and second resistance states are the high and low resistance states, respectively, with the fixed layer of the MTJ 12 disposed closer to the transistor 14 compared to the free layer. In another embodiment, the first and second resistance states are the low and high resistance states, respectively, with the free layer of the MTJ 12 disposed closer to the transistor 14 compared to the fixed layer.

Figure 3:
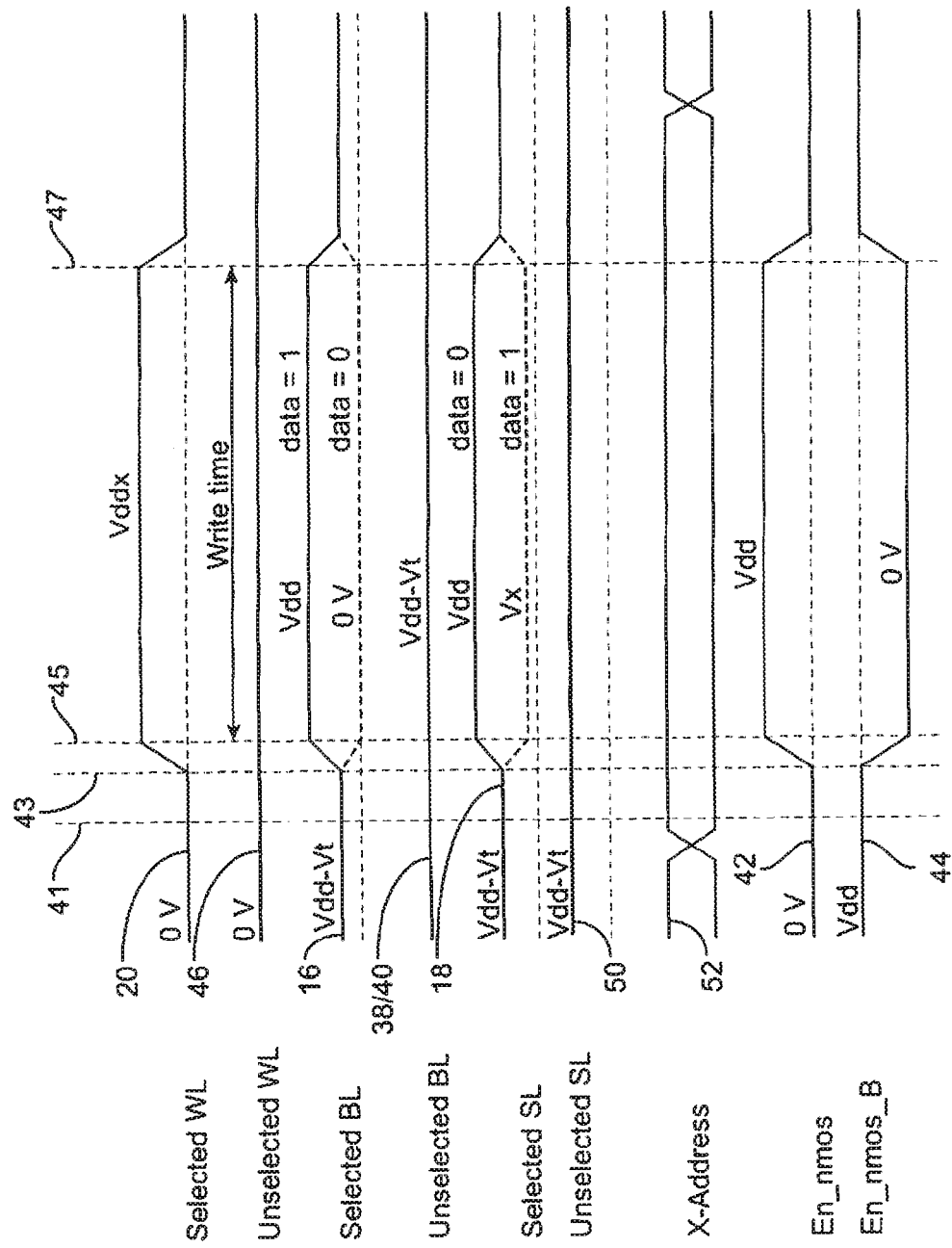
FIG. 3 shows a timing diagram of relevant signals shown in FIG. 2.

FIG. 3 shows a timing diagram of relevant signals shown in FIG. 2. All WLs 20 and 46 are initially grounded and the write operation does not take place. Meanwhile, all BLs 16, 38, 40 and SLs 18, 50 are initially at the voltage of approximately Vdd-Vt. A typical voltage of Vdd-Vt is 1.2-0.4=0.8 volts. However, it is understood that other suitable voltage values may be employed. The signal 42 is at substantially 0 volts and the signal 44 is substantially at Vdd.

Next, at time step 41 in FIG. 3, the address of the location to be programmed or written to is coupled onto the address 52. The signals 42 and 44 are then activated at time step 43 as discussed above, causing the selected WL 20, which is connected to the gate of the access transistor 14 coupled to the MTJ 12 being programmed, to go to Vddx at time step 45. In some embodiments Vddx is 1.5 volts or approximately the sum of Vx and Vdd. Meanwhile, at the time step 45, the selected BL 16 goes to Vdd from Vdd-Vt and the selected SL 18 goes to Vx from Vdd-Vt, thereby driving a switching current through the MTJ 12 from the selected BL 16 to the selected SL 18. Alternatively, the switching current through the MTJ 12 may be reversed by setting the voltages of the selected BL 16 and SL 18 to be 0 volts and Vdd, respectively, at the time step 45, thereby driving a switching current from the selected SL 18 to the selected BL 16. Up to time step 47 in FIG. 3, the write operation takes place and the MTJ 12 is accessed and programmed and at the time step 47, the signals 42 and 44 are deactivated, the selected WL 20 goes down to substantially 0 volts. The unselected WL 46 remains at substantially 0 volts during the write operation. The selected BL 16 and SL 18 go to Vdd-Vt after the time step 47, while the unselected BLs 38, 40 and the unselected SL 50 remain at Vdd-Vt during the write operation. The address 52 remains unchanged at the time step 47 and thereafter until a different address is identified.

Figure 4:
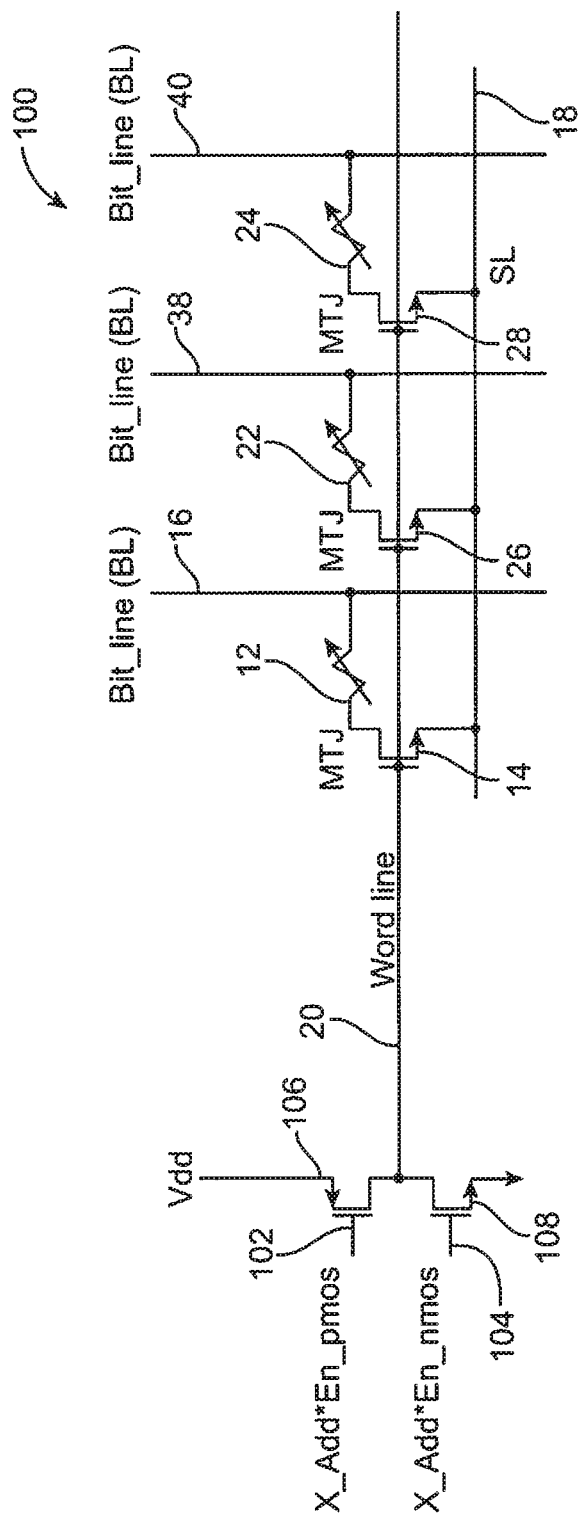
FIG. 4 shows a circuit 100 using a magnetic random access memory (MRAM) device in accordance with another embodiment and method of the invention.

FIG. 4 shows a circuit 100 using a magnetic random access memory (MRAM) device, in accordance with another embodiment and method of the invention. In FIG. 4, the circuit 100 is shown to include the same MTJs, WL, BLs and SL, as that of the embodiment of FIG. 2. The circuit 100 is further shown to include the transistors 106 and 108, both of which are shown coupled to the WL 20. More specifically, the transistor 106 is shown to be a PMOS transistor and the transistor 108 is shown to be an NMOS transistor. The source of the transistor 106 is shown coupled to Vdd and its drain is shown coupled to the WL 20 as well as to the drain of the transistor 108. The gate of the transistor 106 is shown coupled to the X_Add*En_pmos signal 102 and the gate of the transistor 108 is shown coupled to the X_Add*En_nmos 104 signal. The source of the transistor 108 is shown coupled to ground and the drain of the transistor 108 is shown coupled to the drain of the transistor 106 and to the word line 20. The signals 102 and 104 are different in timing but the signals 42 and 44 of FIG. 2, on the other hand, are complementary such that when one is high the other one is low. For example, when the signal 102 is at the logic state "0" or low, the transistor 106 is on and when the signal 104 is at the logic state "0", the transistor 108 is off or deactivated.

Figure 5:
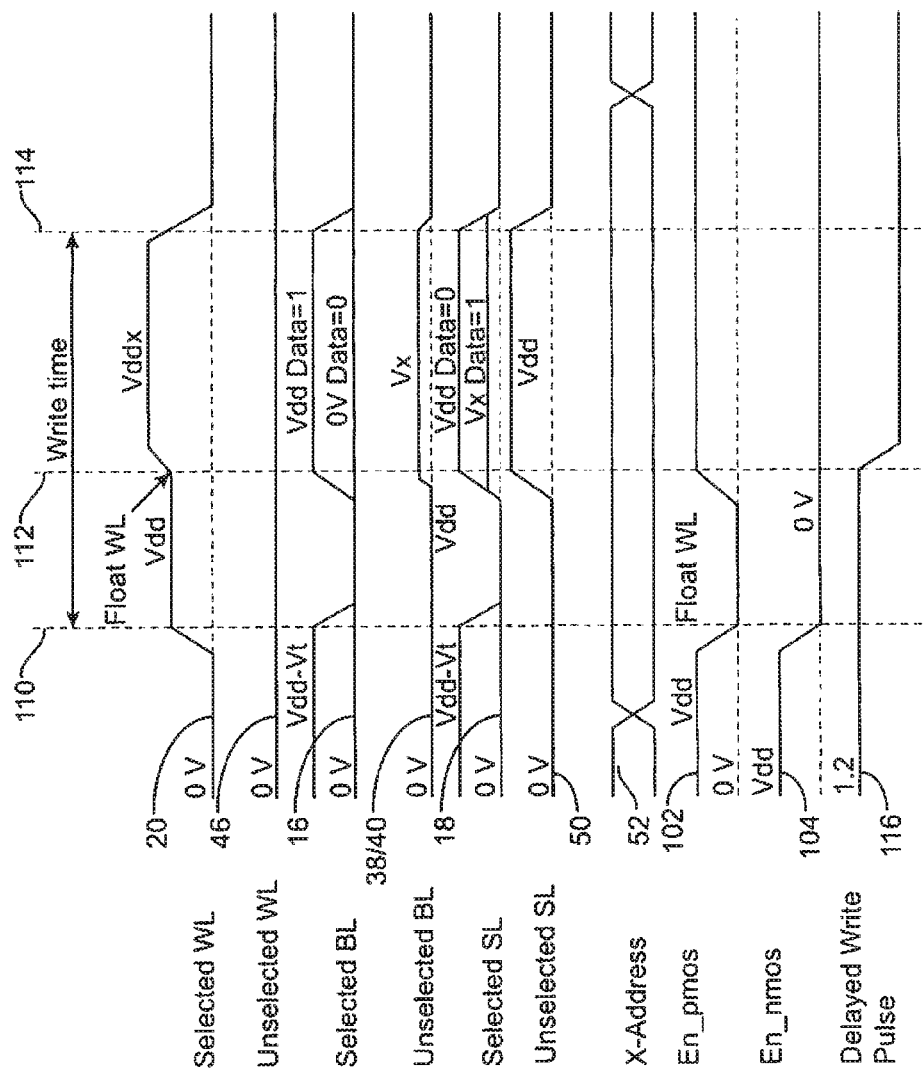
FIG. 5 shows the timing diagram of the relevant signals of FIG. 4.

FIG. 5 is a timing diagram illustrating write operations of the circuit 100 shown in FIG. 4. At time step 110, the voltage of the selected WL 20 is raised to Vdd from 0 V by activating the PMOS transistor 106 through the X_Add*En_pmos signal 102 (0 V), while the unselected WLs, such as the WL 46, are maintained at 0 V. After the voltage of the selected WL 20 reaches Vdd, the voltages selected BL 16 and the selected SL 18 are lowered from Vdd-Vt to 0 V, while the unselected BLs 38 and 40 and unselected SLs, such as the SL 50, are maintained at 0 V. Next, the PMOS transistor 106 is deactivated through the X_Add*En_pmos signal 102 (Vdd), thereby allowing the potential of the selected WL 20 to float. Immediately thereafter at time step 112, the voltages of the selected BL 16 and the selected SL 18 are respectively increased to Vdd and Vx from 0 V to drive a write current through the MTJ 12 from the selected BL 16 to the selected SL 18, thereby switching the MTJ 12 from the first to second resistance state. Alternatively, to switch from the second to the first resistance state, the voltage of the selected BL 16 is maintained at 0 V and the voltage of the selected SL 18 is increased to Vdd at the time step 112, thereby driving the switching current to flow in the opposite direction. Meanwhile, at the same time step 112, the voltage of the unselected BLs 38 and 40 is raised to Vx from 0 V and the voltage of the unselected SL 50 is raised to Vdd from 0 V to boost the voltage of the floating WL 20 from Vdd to Vddx, which is approximately the sum of Vdd and Vx. The boosting of the word line voltage from Vdd to Vddx allows a higher current to flow through the selected transistor 14. In an embodiment, the first and second resistance states are the high and low resistance states, respectively, with the fixed layer of the MTJ 12 disposed closer to the transistor 14 compared to the free layer. In another embodiment, the first and second resistance states are the low and high resistance states, respectively, with the free layer of the MTJ 12 disposed closer to the transistor 14 compared to the fixed layer.

In both embodiments of FIGS. 2 and 4, having the gate voltage of the MTJ that is being programmed, i.e. the MTJ 12, raised to Vddx allows for faster programming of the MTJ 12 while increasing the level of electric current that is allowed to flow through the MTJ 12.

Figure 6:
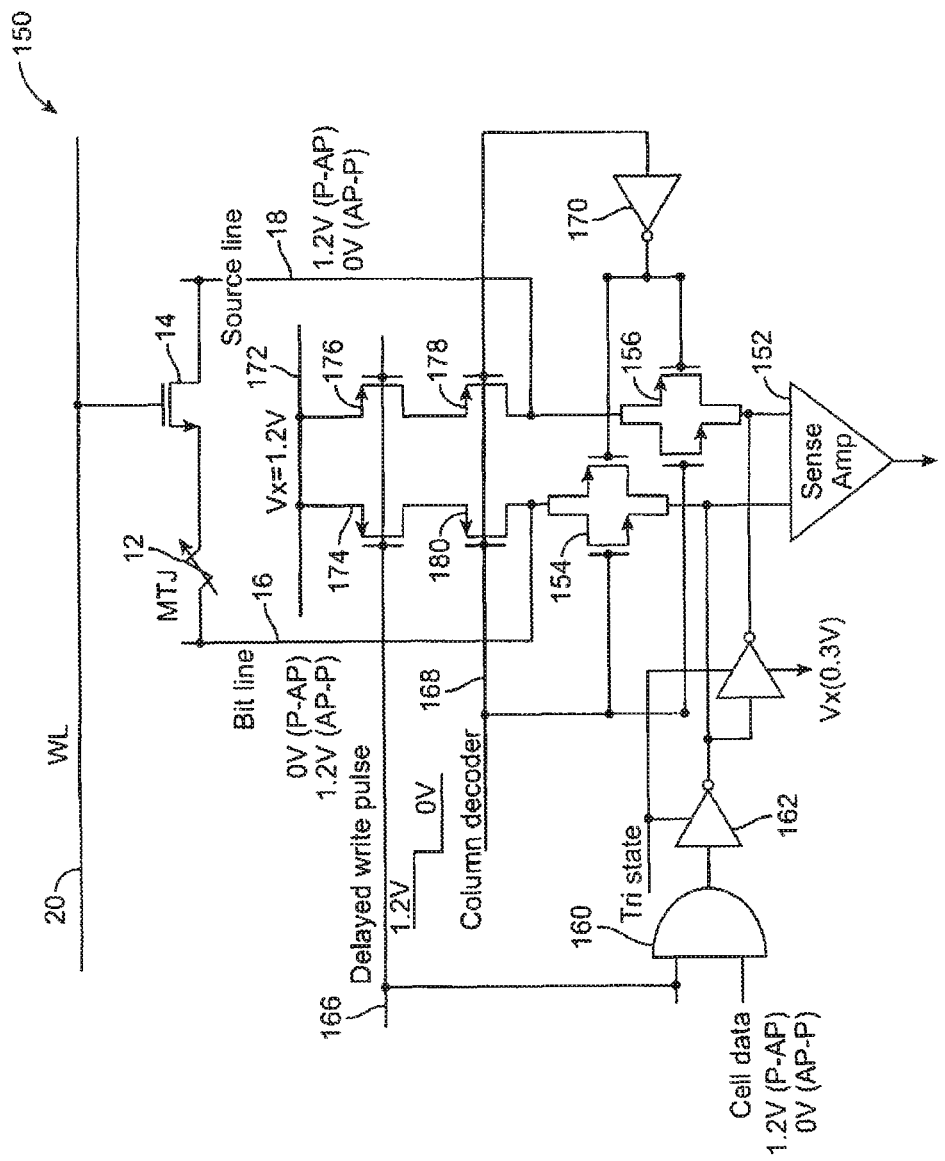
FIG. 6 shows a memory device 150 in accordance with an embodiment of the invention.

FIG. 6 shows a memory device 150 in accordance with an embodiment of the invention. In FIG. 6, some of the signals of FIG. 2, such as those applied to the WL 20, the BL 16, the SL 18 are employed. Further common to FIGS. 6 and 2 are devices, such as the MTJ 12 and the transistor 14. In FIG. 6, the programming of the MTJ 12 is shown in more detail. In this figure the MTJ 12 is coupled to the bit line 16 and the access transistor 14. The access transistor 14 is coupled to the word line 20 and the source line 18. To program the MTJ 12 by driving a switching current through the MTJ 12 from the source line 18 to the bit line 16, the cell data input of the AND 160 is set high to 1.2 V. At the same time the delayed write pulse 166 is set high (1.2 V) to write, and the column decoder 168 is set high to select the bit line 16 and the source line 18. With cell data at 1.2 V, the bit line 16 would be at zero volts, while the source line 18 would be at 1.2V. This way the MTJ 12 would be programmed from the first to second resistance state. Oppositely if the cell data of the AND 160 is set to zero and the delayed write pule 166 and column decoder 168 to 1.2 V, then the bit line 16 will be at 1.2 volts while the source line 18 is at 0 V. This way the MTJ 12 is programmed from the second to first resistance state as the switching current flows through the MTJ 12 from the bit line 16 to the source line 18. In an embodiment, the first and second resistance states are the low and high resistance states, respectively, with the fixed layer of the MTJ 12 disposed closer to the transistor 14 compared to the free layer. In another embodiment, the first and second resistance states are the high and low resistance states, respectively, with the free layer of the MTJ 12 disposed closer to the transistor 14 compared to the fixed layer.

When the column decoder 168 is low then the specific MTJ is not selected for programming. In this situation the two pass gates 154 and 156 are off. When the delayed write pulse 166 goes from 1.2 V down to zero, the two p-channel transistors 176 and 174 turn on and push both the bit line 16 and source line 18 to 1.2 V. The gate capacitance of the transistor 14 then causes the bit line and source line voltage to couple to the word line and push the WL 20 voltage to Vddx, higher in value.

Although the invention has been described in terms of specific embodiment, it is anticipated that alterations and modifications thereof will no doubt become apparent to those more skilled in the art. Such alterations and modifications include, for example, extending the stacks and magnetic tunnel junction from free layer in various three-dimensional conformations, normal to the substrate surface or stacked planes on top, in order to maintain higher capacity. It is therefore intended that the following claims be interpreted as covering all such alterations and modification as fall within the true spirit and scope of the invention.

What is claimed is:

1. A method for programming a magnetic tunnel junction (MTJ) coupled to a transistor, the transistor having a gate, a source, and a drain, the method comprising the steps of:
   boosting a voltage of a word line coupled to the gate of the transistor to substantially a first voltage, the first voltage being approximately a sum of a second voltage and a third voltage, the third voltage being greater than zero volts;
   setting a voltage of a bit line to substantially zero, the bit line being coupled to an end of the MTJ, the other end of the MTJ being coupled to one of the source and drain of the transistor, the other one of the source and drain of the transistor being coupled to a source line;
   setting a voltage of the source line to approximately the second voltage; and
   programming the MTJ from a first resistance state to a second resistance state by driving a current through the MTJ from the source line to the bit line.

2. The method of claim 1, wherein the MTJ includes a magnetic fixed layer and a magnetic free layer with a tunnel junction layer interposed therebetween, each of the magnetic fixed and free layers having a magnetic orientation substantially perpendicular to a layer plane thereof.

3. The method of claim 2, wherein the magnetic orientations of the magnetic fixed and free layers are parallel to each other in the first resistance state.

4. The method of claim 2, wherein the magnetic orientations of the magnetic fixed and free layers are anti-parallel to each other in the first resistance state.

5. The method of claim 1, wherein the third voltage is less than the second voltage.

6. The method of claim 1, wherein the second voltage is a power supply voltage.

7. The method of claim 1, wherein the step of boosting the voltage of the word line includes:
   applying the second voltage to the word line and then allowing the word line to float;
   setting voltages of unselected bit lines to approximately the third voltage and voltages of unselected source lines to approximately the second voltage, thereby boosting the voltage of the word line from the second voltage to substantially the first voltage,
   wherein the unselected sources lines are not coupled to the transistor, and the unselected bit lines are not coupled to the MTJ.

8. The method of claim 1, wherein the other end of the MTJ is at approximately the third voltage during programming.

* * * * *